(12) United States Patent
Adelmann et al.

(10) Patent No.: US 7,191,379 B2
(45) Date of Patent: Mar. 13, 2007

(54) MAGNETIC MEMORY WITH ERROR CORRECTION CODING

(75) Inventors: Todd Christopher Adelmann, Boise, ID (US); Stewart R. Wyatt, Boise, ID (US); Kenneth Kay Smith, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 580 days.

(21) Appl. No.: 10/659,630

(22) Filed: Sep. 10, 2003

(65) Prior Publication Data

US 2005/0055621 A1 Mar. 10, 2005

(51) Int. Cl.
*H03M 13/00* (2006.01)
*G06F 11/00* (2006.01)
*G11C 29/00* (2006.01)

(52) U.S. Cl. .................. 714/758; 714/802; 714/718; 365/201

(58) Field of Classification Search .................. None
See application file for complete search history.

(56) References Cited

U.S. PATENT DOCUMENTS

| | | | |
|---|---|---|---|
| 5,077,737 A | 12/1991 | Leger et al. | |
| 5,428,630 A * | 6/1995 | Weng et al. | 714/763 |
| 5,459,742 A | 10/1995 | Cassidy et al. | |
| 5,754,753 A | 5/1998 | Smelser | |
| 6,374,383 B1 * | 4/2002 | Weng | 714/781 |
| 6,523,132 B1 | 2/2003 | Harari et al. | |
| 6,738,942 B1 * | 5/2004 | Sridharan et al. | 714/755 |
| 6,990,622 B2 * | 1/2006 | Davis et al. | 714/763 |
| 7,032,142 B2 * | 4/2006 | Fujioka et al. | 714/718 |
| 7,036,068 B2 * | 4/2006 | Davis et al. | 714/763 |
| 2003/0023911 A1 | 1/2003 | Davis et al. | |
| 2003/0023922 A1 | 1/2003 | Davis et al. | |
| 2003/0023923 A1 | 1/2003 | Davis et al. | |
| 2003/0023925 A1 | 1/2003 | Davis et al. | |
| 2003/0023927 A1 | 1/2003 | Jedwab et al. | |
| 2003/0023928 A1 | 1/2003 | Jedwab et al. | |
| 2004/0210814 A1 * | 10/2004 | Cargnoni et al. | 714/758 |

* cited by examiner

*Primary Examiner*—Phung My Chung

(57) ABSTRACT

Embodiments of the present invention are implemented in memory systems. In one embodiment, the memory comprises an array of memory cells and a control circuit. The control circuit is configured to read error correction coded data from the array of memory cells, provide error correction code decoding to selected error correction coded data and discard unused error correction code parity data of unselected error correction coded data.

28 Claims, 6 Drawing Sheets

MAGNETIC MEMORY WITH ERROR CORRECTION CODING

BACKGROUND OF THE INVENTION

Electronic memory devices include volatile memory or non-volatile memory. Volatile memory types include dynamic random access memory (DRAM) and static random access memory (SRAM). Non-volatile memory types include reprogrammable memory, such as erasable programmable read only memory (EPROM), electrically erasable programmable read only memory (EEPROM) and FLASH EEPROM memory.

One type of non-volatile, reprogrammable memory known in the art includes magnetic memory cells. These devices, known as magnetic random access memory (MRAM) devices, include an array of magnetic memory cells. The magnetic memory cells may be of different types. For example, the memory cells can be magnetic tunnel junction (MTJ) memory cells or giant magnetoresistive (GMR) memory cells.

Generally, a magnetic memory cell includes a layer of magnetic film in which the orientation of magnetization is alterable and a layer of magnetic film in which the orientation of magnetization may be fixed or "pinned" in a particular direction. The magnetic film having alterable magnetization is referred to as a sense layer or data storage layer and the magnetic film that is fixed is referred to as a reference layer or pinned layer.

Conductive traces referred to as word lines and bit lines are routed across the array of memory cells. Word lines extend along rows of the memory cells, and bit lines extend along columns of the memory cells. A bit of information is stored in a memory cell as an orientation of magnetization in the sense layer at each intersection of a word line and a bit line. The orientation of magnetization in the sense layer aligns along an axis of the sense layer referred to as its easy axis. Magnetic fields are applied to flip the orientation of magnetization in the sense layer along its easy axis to either a parallel or anti-parallel orientation with respect to the orientation of magnetization in the reference layer.

The word lines and bit lines are routed across the array of memory cells for flipping the orientation of magnetization in sense layers. The word lines extend along rows of the memory cells near the sense layers, and the bit lines extend along columns of the memory cells near the reference layers. The word lines and bit lines are electrically coupled to a write circuit.

During a write operation, the write circuit selects one word line and one bit line to change the orientation of magnetization in the sense layer of the memory cell situated at the conductors crossing point. The write circuit supplies write currents to the selected word line and bit line to create magnetic fields in the selected memory cell. The magnetic fields combine to set or switch the orientation of magnetization in the selected memory cell.

The resistance through a memory cell differs according to the parallel or anti-parallel orientation of magnetization of the sense layer and the reference layer. The resistance is highest when the orientation is anti-parallel, which can be referred to as the logic "1" state, and lowest when the orientation is parallel, which can be referred to as the logic "0" state. The resistive state of the memory cell can be determined by sensing the resistance through the memory cell.

In one configuration, word lines and bit lines are used in sensing the resistance through a memory cell. Word lines are electrically coupled to sense layers and bit lines are electrically coupled to reference layers. Word lines and bit lines are also electrically coupled to a read circuit to sense the resistive state of a memory cell.

During a read operation, the read circuit selects one word line and one bit line to sense the resistance through the memory cell situated at the conductors crossing point. In one type of read operation, the read circuit supplies a constant sense voltage across the selected memory cell to generate a sense current through the memory cell. The sense current through the memory cell is proportional to the resistance through the memory cell and is used to differentiate a high resistive state from a low resistive state.

Although a magnetic memory is generally reliable, failures can occur that affect the ability of memory cells to store data. Failures can result from many causes including manufacturing imperfections, internal effects such as noise during a read operation, environmental effects such as temperature and surrounding electromagnetic noise, and aging of the magnetic memory due to use. A memory cell affected by a failure can become unusable, such that no logical value can be read from the memory cell or the logical value read from the memory cell is not necessarily the same as the logical value written to the memory cell. The storage capacity and reliability of the magnetic memory can be severely affected and in the worst case the entire magnetic memory becomes unusable.

Some improvements have been made in manufacturing processes and magnetic memory construction to reduce the number of manufacturing failures and improve magnetic memory longevity. However, the improvements usually involve increased manufacturing costs and complexity, and reduced circuit yields. Hence, techniques are being developed that respond to failures and reduce loss of capacity.

SUMMARY OF THE INVENTION

Embodiments of the present invention are implemented in memory systems. In one embodiment, the memory comprises an array of memory cells and a control circuit. The control circuit is configured to read error correction coded data from the array of memory cells, provide error correction code decoding to selected error correction coded data and discard unused error correction code parity data of unselected error correction coded data.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
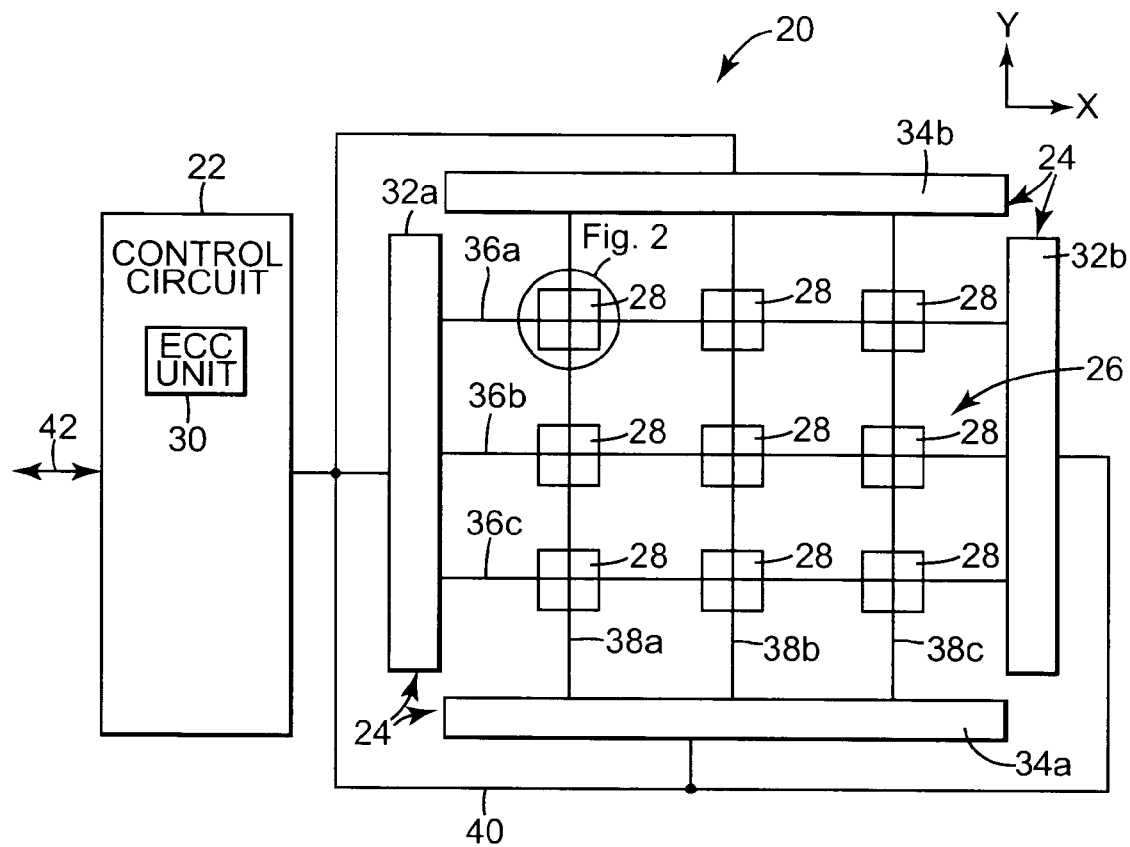
FIG. 1 is a diagram illustrating an exemplary embodiment of a magnetic memory, according to the present invention.

FIG. 1 is a diagram illustrating an exemplary embodiment of a magnetic memory 20, according to the present invention. The magnetic memory 20 includes a control circuit 22, a read/write circuit 24 and a magnetic memory cell array, indicated at 26. The memory cell array 26 includes magnetic memory cells 28. The control circuit 22 includes an error correction code (ECC) unit, indicated at 30. The ECC unit 30 encodes and decodes data that is stored in the memory cell array 26.

The exemplary embodiment is directed to magnetic memory 20. Other embodiments can use other suitable memory types, including phase-change random access memory (PCRAM), FLASH random access memory (RAM) and probe based memories. In probe based memories, an array of mechanical probes interact with portions of the memory media to read data from and write data into the memory media. Methods for storing data in the probe based memory include charge storage, magnetic, thermo-mechanical and phase change methods.

In the exemplary embodiment, control circuit 22 receives original data from external sources, such as a host system. The received data is encoded using an ECC scheme and written into array 26. Control circuit 22 reads the ECC encoded data from array 26 and checks the integrity of the ECC encoded data. In the event the integrity of the ECC encoded data has been compromised, control circuit 22 decodes the ECC encoded data using ECC unit 30. The ECC unit 30 decodes and corrects the compromised ECC encoded data to obtain recovered original data. The recovered data is provided to external sources. In the event the integrity of the ECC encoded data has not been compromised, the ECC parity data is discarded and the retrieved original data is passed to external sources, without decoding the ECC encoded data with ECC unit 30. In other words, control circuit 22 decodes some of the stored ECC encoded data read from array 26, but not all. Decoding some, but not all, of the ECC encoded data read from array 26 reduces the time and power used reading array 26 and providing recovered and original data to external sources.

Control circuit 22 checks the integrity of ECC encoded data read from array 26 in an error detection scheme that is fast relative to ECC decoding. The error detection scheme can be any suitable error detection scheme. In one exemplary embodiment, control circuit 22 checks the integrity of ECC encoded data read from array 26 using a cyclical redundancy check (CRC) checksum. Control circuit 22 receives original data from external sources and encodes the original data using an ECC scheme and ECC unit 30. The ECC encoded data is passed through a CRC unit to calculate a CRC checksum for the ECC encoded data. The ECC encoded data and the CRC checksum are written into array 26. Control circuit 22 reads the ECC encoded data and the CRC checksum from array 26 and calculates a new CRC checksum for the ECC encoded data. The new CRC checksum is compared to the retrieved CRC checksum. In the event the CRC checksums match, the ECC encoded data is deemed reliable and ECC decoding is not performed. In the event the CRC checksums do not match, the ECC encoded data read from array 26 is deemed unreliable. The unreliable ECC encoded data is decoded and corrected using ECC unit 30.

In another embodiment, the integrity of ECC encoded data read from array 26 is determined by evaluating resistance readings from the memory cells 28 storing the ECC encoded data. Where the resistance readings violate predetermined resistance reading threshold values, the retrieved ECC encoded data is deemed unreliable. The unreliable ECC encode data is decoded and corrected using ECC unit 30. In the event the resistance readings do not violate the predetermined threshold values, the ECC encoded data is not decoded. Instead, the ECC parity data, that is part of the ECC encoded data, is discarded leaving the original data. The original data is passed directly to external sources. In other embodiments, other suitable integrity checks can be used, such as odd/even parity checks and resistance readings of test memory cells in array 26.

The magnetic memory cells 28 are arranged in rows and columns, with the rows extending along an x-direction and the columns extending along a y-direction. Only a relatively small number of memory cells 28 are shown to simplify the illustration of the magnetic memory 20. In practice, arrays of any suitable size can be used and the arrays can be stacked to form 3-dimensional macro-array structures that operate in highly parallel modes, such as the macro-array described later herein.

In the exemplary embodiment, read/write circuit 24 includes read/write row circuits 32a and 32b, and read/write column circuits 34a and 34b. The row circuits 32a and 32b are electrically coupled to word lines 36a–36c and the column circuits 34a and 34b are electrically coupled to bit lines 38a–38c. The conductive word lines 36a–36c extend along the x-direction in a plane on one side of array 26. The conductive bit lines 38a–38c extend along the y-direction in a plane on an opposing side of array 26. There is one word line 36a–36c for each row of the array 26, and one bit line 38a–38c for each column of the array 26. A memory cell 28 is located at each cross-point of a word line 36a–36c and a bit line 38a–38c.

The control circuit 22 is electrically coupled to row circuits 32a and 32b, and column circuits 34a and 34b through conductive read/write paths, indicated at 40. In addition, control circuit 22 is electrically coupled to external sources through conductive input/output (I/O) paths, indicated at 42. Control circuit 22 includes I/O circuits for communicating with external sources and the read/write circuit 24. Also, control circuit 22 includes an embedded processor and non-volatile memory. The non-volatile memory stores an operating program for the embedded processor and control circuit 22. Control circuit 22 and ECC unit 30 control encoding and decoding of data stored in array 26.

The control circuit 22 controls the read/write circuit 24 to write data into array 26 and read data from array 26. Control circuit 22 receives write addresses and original data from external sources through I/O paths 42. Control circuit 22 also receives read addresses from external sources and transmits original data to external sources through I/O paths 42. Control circuit 22 and array 26 can be formed on a single substrate or arranged separately. In the exemplary embodiment, control circuit 22 and array 26 are formed on separate substrates.

During a write operation, control circuit 22 receives an external write address and original data through I/O paths 42. Control circuit 22 encodes the received original data with ECC unit 30 and provides the ECC encoded data and a write address to read/write circuit 24. The write address can be the provided external write address, i.e. the logical address, or a corresponding array read/write address, i.e. the physical address, where the external write address is mapped to the corresponding array read/write address.

Read/write circuit 24 provides write currents through word lines 36a–36c and bit lines 38a–38c to write memory cells 28 in array 26. To write a selected memory cell 28, row circuits 32a and 32b provide a first write current through a selected word line 36a–36c, and column circuits 34a and 34b provide a second write current through a selected bit line 38a–38c. The row circuits 32a and 32b can provide the first write current through the selected word line 36a–36c in either direction as needed for writing the selected memory cell 28. The column circuits 34a and 34b can provide the second write current through the selected bit line 38a–38c in either direction as needed to write the selected memory cell 28. The first write current flows from/to row circuit 32a and through the selected word line 38a–38c to/from row circuit 32b. The second write current flows from/to column circuit 34a and through the selected bit line 38a–38c to/from column circuit 34b. One read/write circuit 24 is illustrated as coupled to array 26. In practice, any suitable number of read/write circuits, such as read/write circuit 24, are coupled to array 26 and the array 26 includes any suitable number of memory cells 28. The memory cells 28 in array 26 are written to and read from in highly parallel modes.

During a write operation, row circuits 32a and 32b select one word line 36a–36c and column circuits 34a and 34b select one bit line 38a–38c to set or switch the orientation of magnetization in the sense layer of the memory cell 28 located at the cross-point of the selected word line 36a–36c and bit line 38a–38c. Row circuits 32a and 32b provide the first write current to the selected word line 36a–36c and column circuits 34a and 34b provide the second write current to the selected bit line 38a–38c. The first write current creates a magnetic field around the selected word line 36a–36c, according to the right hand rule, and the second write current creates a magnetic field around the selected bit line 38a–38c, according to the right hand rule. The magnetic fields combine to set or switch the orientation of magnetization in the sense layer of the selected memory cell 28.

During a read operation, control circuit 22 receives an external read address through I/O paths 42. Control circuit 22 passes the external read address, i.e. the logical address, or the corresponding array read/write address, i.e. the physical address, to read/write circuit 24. The read/write circuit 24 reads the data stored at the provided address in array 26. Control circuit 22 retrieves ECC encoded data from array 26 and evaluates the integrity of the ECC encoded data. In the event the ECC encoded data is unreliable, control circuit 22 decodes the ECC encoded data with the ECC unit 30 and provides the decoded data, i.e., recovered data, to external sources through I/O paths 42. In the event the ECC encoded data read from array 26 is deemed reliable, control circuit 22 discards the ECC parity data and provides the remaining data, i.e., original data, to external sources through the I/O paths 42.

During a read operation, read/write circuit 24 selects one word line 36a–36c and one bit line 38a–38c to sense the resistance through the selected memory cell 28 located at the cross-point of the selected word line 36a–36c and bit line 38a–38c. The row circuit 32a selects a word line 36a–36c, and the column circuit 34a selects a bit line 38a–38c. The row circuit 32a electrically couples the selected word line 36a–36c to ground. The column circuit 34a provides a constant sense voltage on the selected bit line 38a–38c to produce a sense current through the selected memory cell 28. The magnitude of the sense current through the selected memory cell 28 corresponds to the resistive state and the logic state of the selected memory cell 28. The column circuit 34a senses the magnitude of the sense current and provides a logic output signal to control circuit 22. The logic output signal is a high or low logic level indicating the resistive state of the selected memory cell 28.

Figure 2:
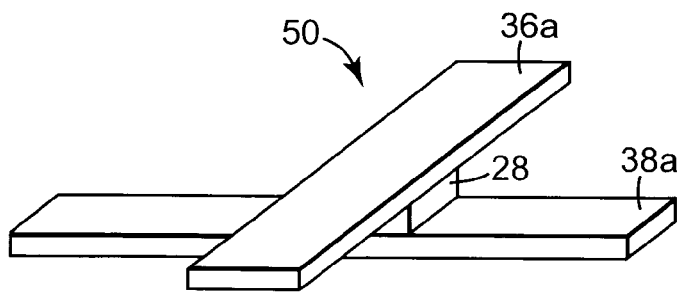
FIG. 2 is a diagram illustrating an exemplary embodiment of an array section.

FIG. 2 is a diagram illustrating an exemplary embodiment of an array section, indicated at 50. Array section 50 includes a word line 36a, memory cell 28 and a bit line 38a. Memory cell 28 is located between word line 36a and bit line 38a. In the exemplary embodiment, word line 36a and bit line 38a are orthogonal to one another. In other embodiments, word line 36a and bit line 38a can lie in other suitable angular relationships with one another.

In the exemplary embodiment, word line 36a and bit line 38a are electrically coupled to read/write circuit 24. The word line 36a is electrically coupled to row circuits 32a and 32b, and the bit line 38a is electrically coupled to column circuits 34a and 34b. To write memory cell 28, row circuits 32a and 32b provide a first write current to word line 36a and column circuits 34a and 34b provide a second write current to bit line 38a. The first write current through word line 36a creates a magnetic field, according to the right hand rule, around word line 36a and in memory cell 28. The second write current through bit line 38a creates a magnetic field, according to the right hand rule, around bit line 38a and in memory cell 28. The magnetic fields combine to set or switch the state of memory cell 28.

To read the resistive state and logic state of memory cell 28, row circuit 32a electrically couples word line 36a to ground, and column circuit 34a provides a constant sense voltage on bit line 38a. The constant sense voltage across memory cell 28 produces a sense current through memory cell 28 from the bit line 38a to the word line 36a and ground. The magnitude of the sense current indicates the resistive state of memory cell 28. Column circuit 34a senses the magnitude of the sense current and provides an output signal indicative of the resistive state and logic state of memory cell 28 to control circuit 22.

Figure 3:
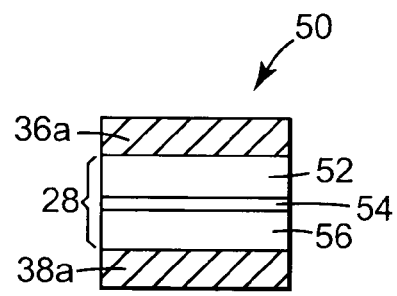
FIG. 3 is a diagram illustrating a cross-section of the exemplary embodiment of an array section.

FIG. 3 is a diagram illustrating a cross-section of the exemplary embodiment of array section 50. Array section 50 includes memory cell 28 located between word line 36a and bit line 38a. Memory cell 28 includes a sense layer 52, a spacer layer 54 and a reference layer 56. The spacer layer 54 is located between the sense layer 52 and the reference layer 56. The sense layer 52 is located between the spacer layer 54 and the word line 36a. The reference layer 56 is located between the spacer layer 54 and the bit line 38a.

The sense layer 52 has an alterable orientation of magnetization and the reference layer 56 has a pinned orientation of magnetization. In the exemplary embodiment, memory cell 28 is an MTJ spin-tunneling device, with the spacer layer 54 being an insulating barrier layer through which an electrical charge tunnels during read operations. Electrical charge tunneling through the spacer layer 54 occurs in response to a sense voltage across memory cell 28. In another embodiment, a GMR structure can be used for memory cell 28, with the spacer layer 54 being a conductor, such as copper.

Figure 4:
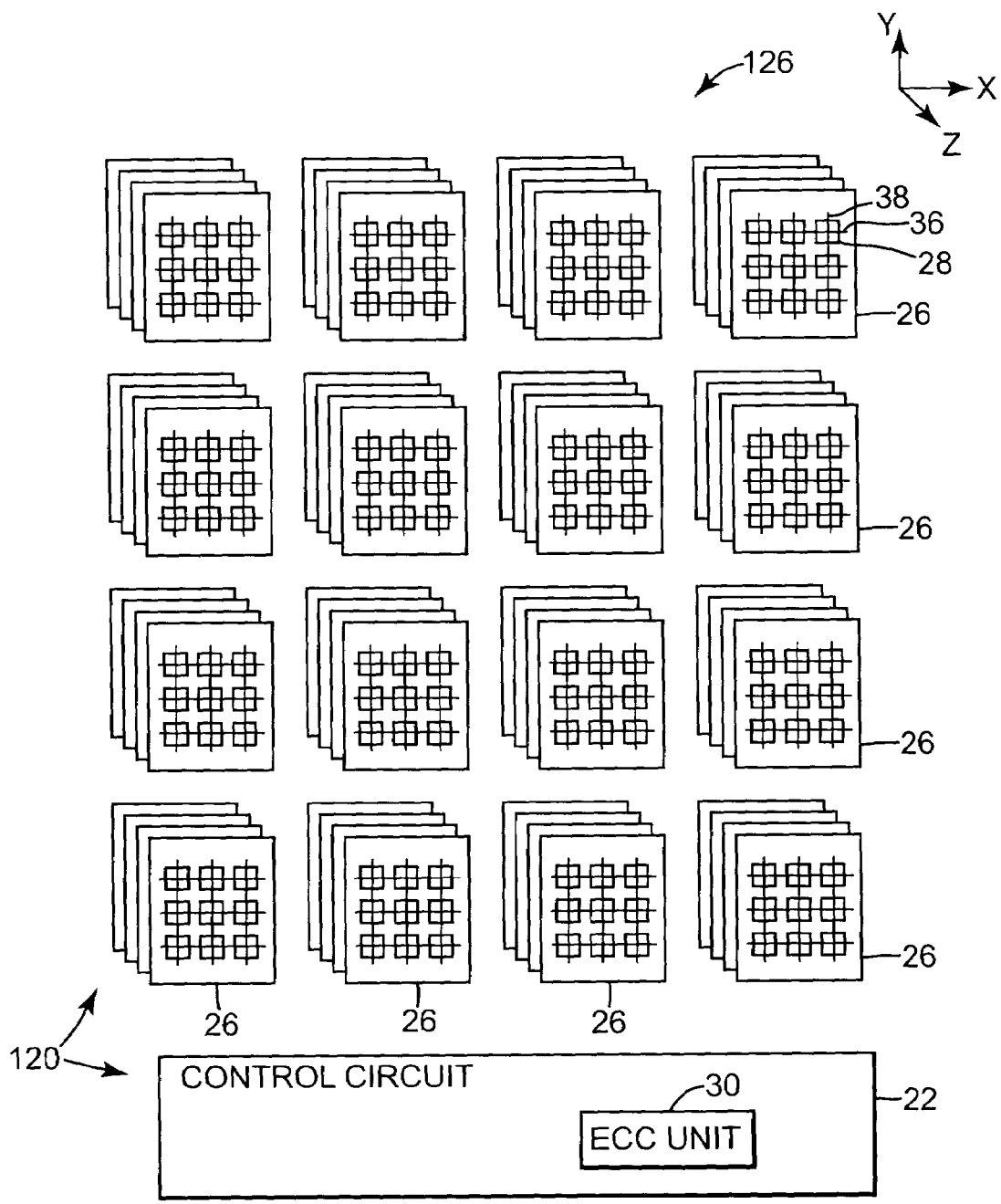
FIG. 4 is a diagram illustrating another magnetic memory.

FIG. 4 is a diagram illustrating another magnetic memory 120. The magnetic memory 120 includes a macro-array 126 and control circuit 22. The control circuit 22 includes ECC unit 30. The macro-array 126 includes a plurality of magnetic memory cell arrays 26. Each memory cell array 26 includes memory cells 28 that are intersected by word lines 36 and bit lines 38. The arrays 26 are formed and electrically coupled to control circuit 22 as previously described. Using multiple, individual arrays 26 in a macro-array, such as macro-array 126, makes it possible to have a macro-array with a large overall data storage capacity, without the individual arrays 26 becoming so large that they are difficult to manufacture and control.

The arrays 26 are arranged in rows and columns, with the rows extending along the x-direction and the columns extending along the y-direction. In addition, the arrays 26 are arranged in stacks that extend along the z-direction. Only a relatively small number of memory cells 28 and arrays 26 are shown to simplify the illustration. In practice, arrays of any suitable size and macro-arrays of any suitable size can be used.

In one suitable 128 M byte macro-array, 1024 arrays are arranged in a macro-array that is 16 arrays high, by 16 arrays wide, with four stack layers. Each individual array is a one M bit array that is 1024 memory cells high by 1024 memory cells wide. Optionally, the magnetic memory comprises more than one such macro-array.

In one suitable addressing scheme for the 128 M byte array, memory cells are accessed by selecting one word line in each of a plurality of arrays and by selecting multiple bit lines in each of the plurality of arrays. Selecting multiple bit lines in each array, selects multiple memory cells from each array. The accessed memory cells within each of the plurality of arrays correspond to a small portion of a unit of data. Together, the accessed memory cells provide a whole unit of data, such as a sector of 512 bytes, or a substantial portion of a whole unit of data. The memory cells are accessed substantially simultaneously.

In the exemplary embodiment of magnetic memory 120, memory cells 28 are accessed by selecting one word line 36 and multiple bit lines 38 in each of a plurality of arrays 26 to thereby select a plurality of memory cells 28. The accessed memory cells 28 correspond to at least a portion of a whole section of data, such as a sector of 512 bytes. The plurality of arrays 26 can be accessed substantially simultaneously. In other embodiments and in practice, other suitable accessing schemes can be used, such as selecting one bit line 38 and multiple word lines 36 in each of a plurality of arrays 26.

Although arrays 26 and 126 are generally reliable, failures can occur that affect the ability of memory cells 28 to store data. Failures can be classified as either systematic failures or random failures. Systemic failures consistently affect a particular memory cell 28 or a particular group of memory cells 28. Random failures occur transiently and are not consistently repeatable. Systematic failures usually arise as a result of manufacturing imperfections and aging. Random failures occur in response to internal and external environmental effects, such as noise during a read or write process, temperature and surrounding electromagnetic noise. A memory cell 28 affected by a failure can become unreadable such that no logical value can be read from the memory cell 28 or the logical value read from the memory cell 28 is not necessarily the same as the logical value written to the memory cell 28.

Failure mechanisms take many forms including shorted bits, open bits, half-select bits and single failed bits. In shorted bits, the resistance through the memory cell 28 is much lower than expected. Shorted bits tend to affect all memory cells 28 lying in the same row and the same column. In open bits, the resistance through the memory cell 28 is much higher than expected. Open bit failures can, but do not always, affect all memory cells 28 lying in the same row or column, or both. Half-select bit failures occur when writing to a memory cell 28 in a particular row or column causes another memory cell 28 in the same row or column to change state. A memory cell 28 that is vulnerable to a half-select failure will therefore possibly change state in response to writing any memory cell 28 in the same row or column, resulting in unreliable stored data. A single failed bit is where a particular memory cell 28 is fixed in a high resistive or a low resistive state. A single failed bit does not necessarily affect other memory cells 28 and is not affected by activity in other memory cells 28.

These four example failure mechanisms are systematic failures, in that the same memory cell(s) 28 are consistently affected. Where the failure mechanism affects only one memory cell 28, it is referred to as an isolated failure. Where the failure mechanism affects a group of memory cells 28, it is referred to as a grouped failure.

While memory cells 28 can be used to store data according to any suitable logical layout, data is preferably organized into basic sub-units, such as bytes. In turn, the basic sub-units are grouped into larger logical data units, such as sectors. A physical failure, and in particular a grouped failure affecting many memory cells 28 can affect many bytes and possibly many sectors. A single physical failure can potentially affect a large number of logical data units, such that avoiding the use of all bytes, sectors or other units affected by failure substantially reduces the storage capacity of the magnetic memory 20 and 120. For example, a grouped failure such as a shorted bit failure in just one memory cell 28 affects many other memory cells 28 that lie in the same row or the same column. In a one M bit array that is 1024 memory cells 28 by 1024 memory cells 28, a single shorted bit failure in one memory cell 28 can affect over 1000 other memory cells 28 lying in the same row, and over 1000 memory cells 28 lying in the same column. The affected memory cells 28 may be part of many bytes and many sectors, and not using the affected bytes and sectors reduces the storage capacity of the magnetic memory.

In the exemplary embodiment, some or all of the affected bytes and sectors are used for storing data. The data is encoded with an ECC scheme and stored as ECC encoded data in the arrays 26. Error correction coding involves receiving original data for storage and forming ECC encoded data that allows errors to be identified and ideally corrected. The ECC encoded data includes the original data and ECC parity data. The ECC encoded data is stored in array 26 and 126 in magnetic memories 20 and 120.

During a read operation, the original data can be recovered from corrupted ECC encoded data by ECC decoding the corrupted ECC encoded data. The ECC unit 30 uses the ECC parity data to decode and correct the corrupted ECC encoded data and recover the original data. ECC decoding is a time consuming and power consuming process. Where the ECC encoded data is not corrupted, the ECC parity data can be discarded from the ECC encoded data to obtain the original data. Uncorrupted ECC encoded data is not provided to the ECC unit 30 for decoding to recover original data. Discarding ECC parity data that is not used, i.e., idle ECC parity data, to obtain original data without ECC decoding reduces the time and power consumed.

A wide range of ECC schemes are available and can be employed alone or in combination. Suitable ECC schemes include schemes with single-bit symbols, such as Bose Chaudhufi Hocquenghem (BCH) and schemes with multiple-bit symbols, such as Reed-Solomon codes.

ECC background information can be found in the following publication: W. W Peterson and E. J. Weldon, Jr., "Error-Correcting Codes", $2^{nd}$ Edition, $12^{th}$ Printing, 1994, MIT Press, Cambridge, Mass. which is incorporated herein by reference. A more specific reference concerning Reed-Solomon codes is "Reed-Solomon Codes And Their Applications", ED. S. B. Wicker and V. K. Bhargava, IEEE Press, New York, 1994, which is incorporated herein by reference.

Figure 5:
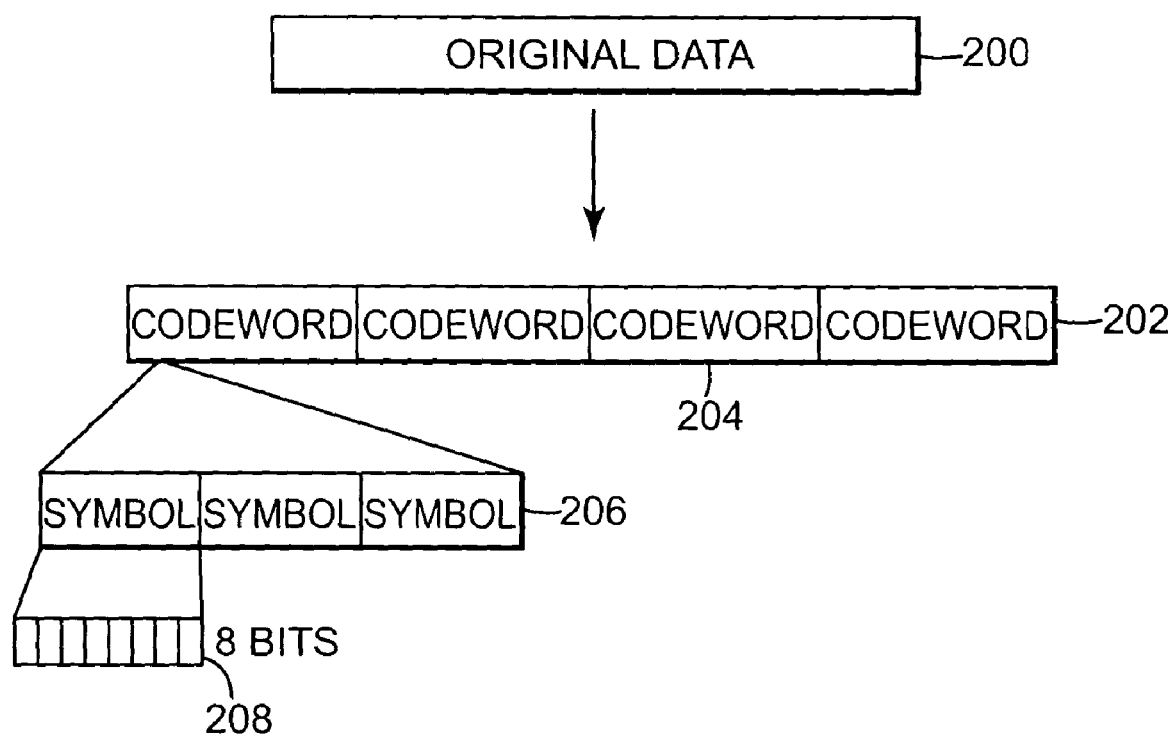
FIG. 5 is a diagram illustrating an exemplary logical data structure for ECC encoded data stored in arrays.

FIG. 5 is a diagram illustrating an exemplary logical data structure for ECC encoded data stored in arrays 26 and 126. Original data is received by control circuit 22 in an original data sector comprising 512 bytes, indicated at 200. Control circuit 22 and ECC unit 30 encode the received original data sector 200 and provide the ECC encoded data sector, indicated at 202.

The ECC encoded data sector 202 comprises four codewords 204. Each codeword 204 comprises 160 symbols 206. In the exemplary embodiment, a Reed-Solomon ECC encoding scheme is used where each symbol 206 comprises 8 bits, indicated at 208. In other embodiments, each symbol 206 can be a single bit (e.g. a BCH code with single-bit symbols) or multiple bits other than 8 bits, such as 10 bits (e.g. a Reed-Solomon code using multiple-bit symbols). The 8 bits 208 correspond to a symbol 206 and are stored in eight memory cells 28, termed a symbol group. A physical failure that directly or indirectly affects any of the eight memory cells 28 in a symbol group can result in one or more of the bits being unreadable and giving a failed symbol 206.

Each block of stored ECC encoded data is read from memory cells 28 and received by control circuit 22. The control circuit 22 and ECC unit 30 decode the ECC encoded data and identify and correct failed symbols 206. Decoding is performed independently for each block of ECC encoded data, such as ECC encoded data sector 202 or ECC codeword 204.

In the exemplary embodiment, control circuit 22 and ECC unit 30 provide a Reed-Solomon ECC scheme to encode received original data 200. The Reed-Solomon scheme is a linear error correcting code that mathematically identifies and corrects up to a predetermined maximum number of failed symbols 206 within each block of ECC encoded data. For example, a [160, 128, 32] Reed-Solomon code producing codewords of 160, 8 bit symbols corresponding to 128 original data bytes can locate and correct up to 16 random errors in 160 bytes. In another example, a [132, 128, 4] Reed-Solomon code producing codewords of 132, 8 bit symbols corresponding to 128 original data bytes can locate and correct up to two random errors in 132 bytes.

An ECC scheme is selected with a power sufficient to recover original data 200 from the ECC encoded data in substantially all cases. In the exemplary embodiment, control circuit 22 and ECC unit 30 provide a [160, 128, 32] Reed-Solomon code for encoding and decoding original data 200. The original data 200 is divided into four codewords 204. Each codeword 204 includes 128 bytes of original data and 32 bytes of ECC parity data resulting in a codeword length of 160 bytes and an ECC encoded sector 202 length of 640 bytes. In other embodiments, control circuit 22 and ECC unit 30 can provide any suitable ECC scheme, such as a [132, 128, 4] Reed-Solomon code.

Figure 6:
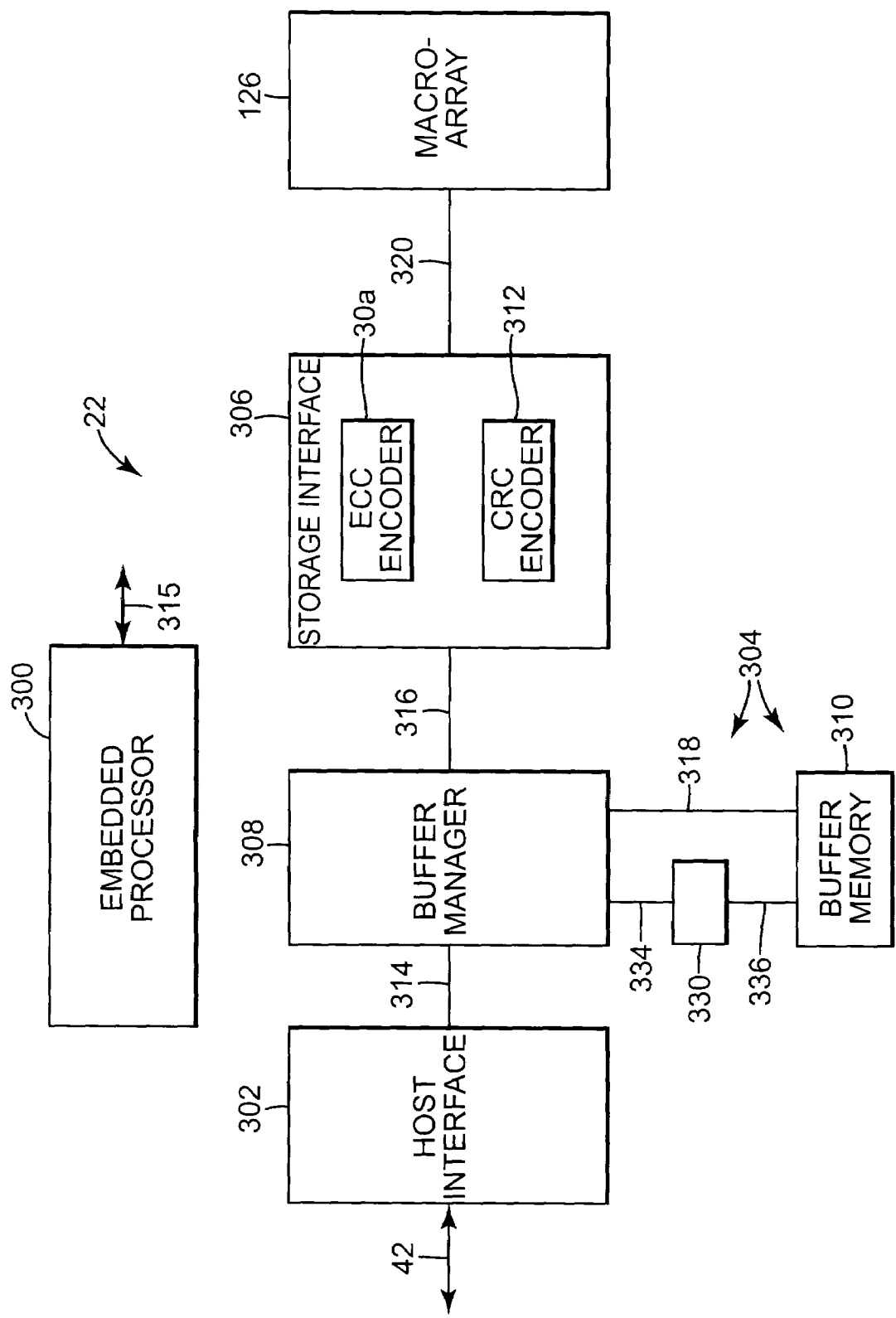
FIG. 6 is a diagram illustrating components of the exemplary embodiment of a control circuit for writing data into a macro-array.
Figure 7:
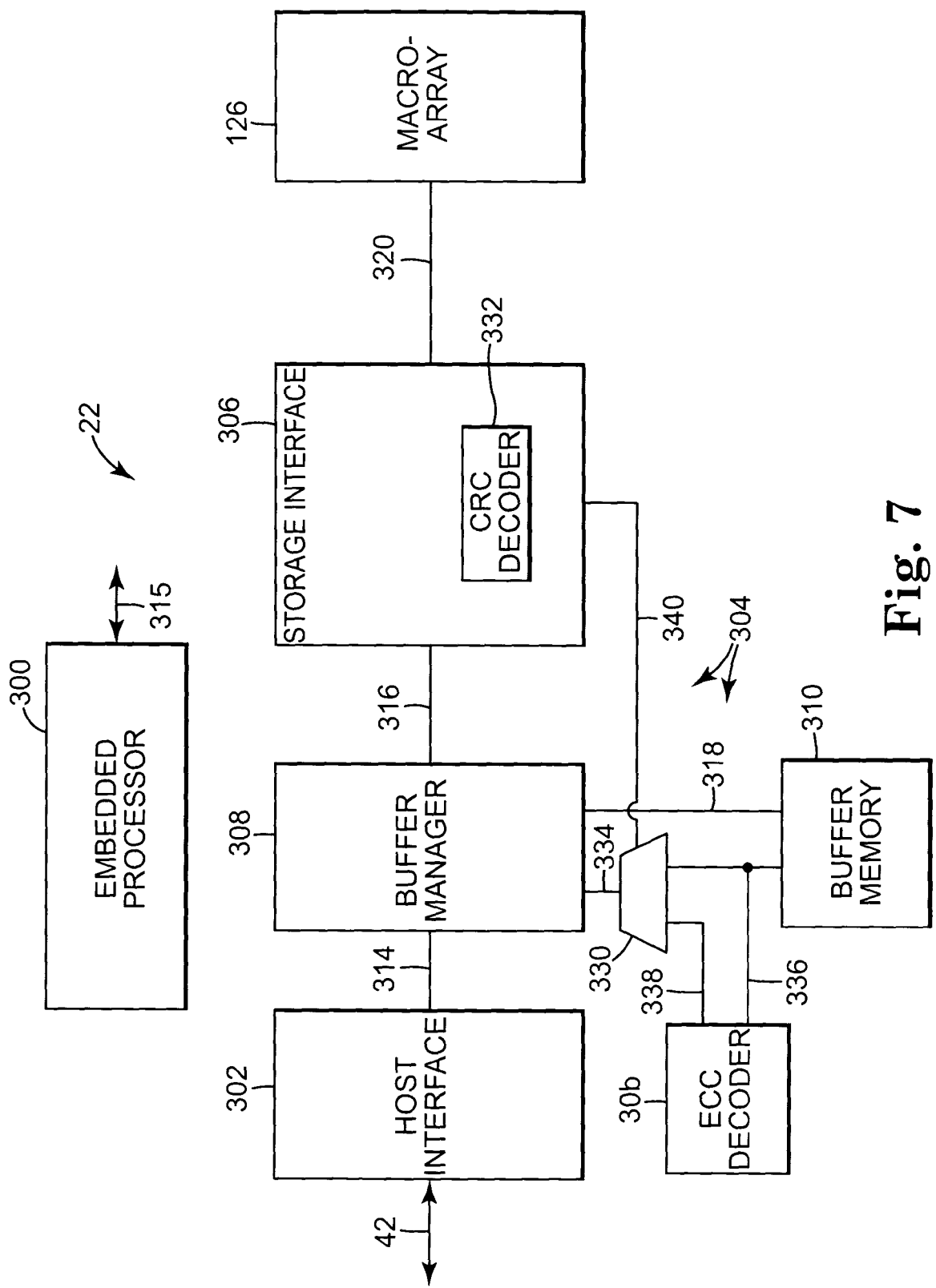
FIG. 7 is a diagram illustrating components of the exemplary embodiment of a control circuit for reading data from a macro-array.

FIGS. 6 and 7 are diagrams illustrating different aspects of one exemplary embodiment of control circuit 22 in communication with macro-array 126. FIG. 6 illustrates write components of the exemplary embodiment of control circuit 22 for writing macro-array 126, and FIG. 7 illustrates read components of the exemplary embodiment of control circuit 22 for reading macro-array 126. The read and write components are part of control circuit 22.

FIG. 6 is a diagram illustrating components of the exemplary embodiment of control circuit 22 for writing data into macro-array 126. Control circuit 22 includes an embedded processor 300, a host interface 302, a buffer circuit 304 and a storage interface 306. The buffer circuit 304 includes a buffer manager 308, a multiplexer 330 and a buffer memory 310. The storage interface 306 includes an ECC encoder 30a and a CRC encoder 312.

The embedded processor 300 controls operation of control circuit 22 and is in electrical communication, indicated at 315, with host interface 302, buffer circuit 304 and storage interface 306. Conductive paths between the embedded processor 300 and other components are not shown to simplify the illustration. In the exemplary embodiment, the embedded processor 300 is a reduced instruction set computing (RISC) processor. In other embodiments, the embedded processor 300 can be any suitable processor, such as a general purpose processing core, or the processor 300 can be replaced with a finite state machine (FSM).

The host interface 302 is electrically coupled to external sources through I/O paths 42 and to buffer circuit 304 through internal I/O paths 314. In addition, host interface 302 is in electrical communication with embedded processor 300. The host interface 302 is the control circuits' interface to external sources, such as a compact FLASH controller or a secured digital memory interface. The embedded processor 300 controls the host interface 302 to receive and send data to host systems through I/O paths 42.

The buffer circuit 304 includes buffer manager 308, multiplexer 330 and buffer memory 310. The buffer manager 308 is electrically coupled to the host interface 302 through internal I/O paths 314 and to storage interface 306 through conductive paths, indicated at 316. In addition, the buffer manger 308 is electrically coupled to buffer memory 310 through conductive memory input paths 318, and to multiplexer 330 through multiplexer output paths 334. The buffer manager 308 controls data transfers to and from buffer memory 310.

Buffer memory 310 is electrically coupled to buffer manager 308 through memory input paths 318. In addition, buffer memory 310 is electrically coupled to multiplexer 330 through memory output paths 336. Buffer memory 310 is controlled by buffer manager 308 to provide data on memory output paths 336. During write operations, multiplexer 330 passes data on memory output paths 336 to multiplexer output paths 334 and buffer manager 308.

The buffer manager 308 includes digital logic controlled by embedded processor 300. The buffer manager 308 receives data from host interface 302 and transmits the received data to storage interface 306. In the event the buffer manager 308 receives data from host interface 302 faster than storage interface 306 can receive data, buffer manager 308 stores the received data in buffer memory 310. The stored data is retrieved by buffer manager 308 and transmitted to storage interface 306 through a series of handshakes. The buffer manager 308 also receives data from storage interface 306 and transmits data to host interface 302. Data received from storage interface 306 is stored in buffer memory 310 and processed prior to transmitting the data to host interface 302 and external sources.

Buffer memory 310 stores data received from buffer manager 308. Buffer manager 308 reads data from buffer memory 310 and passes the data to host interface 302 or storage interface 306. The buffer memory 310 is a volatile memory, such as static random access memory (SRAM) or dynamic random access memory (DRAM).

The storage interface 306 is located between the buffer manager 308 and macro-array 126. The storage interface 306 is electrically coupled to buffer manager 308 through conductive paths, indicated at 316, and to macro-array 126 through conductive paths, indicated at 320. The storage interface 306 includes CRC encoder 312 and ECC encoder 30a that is part of ECC unit 30. Digital logic of the storage interface 306 is electrically coupled to the ECC encoder 30a and CRC encoder 312. The storage interface 306 controls ECC encoding and CRC encoding of original data received from buffer manager 308.

In the exemplary embodiment, ECC encoder 30a is a digital hardware implementation of an ECC encoder. The ECC encoder 30a provides a [160, 128, 32] Reed-Solomon code for encoding received original data. The ECC encoder 30a receives original data and processes the data to provide Reed-Solomon ECC encoded data. The Reed-Solomon ECC encoded data includes the original received data and ECC parity data. For example, 160 bytes of [160, 128, 32] Reed-Solomon ECC encoded data includes 128 bytes of original data and 32 bytes of ECC parity data. In other embodiments, the ECC encoder 30a can be a software/firmware ECC encoder executed by the embedded processor 300 to provide ECC encoded data. Also, in other embodiments, the ECC encoder 30a can encode original data with a different ECC scheme, such as the [132, 128, 4] Reed-Solomon code or a BCH code.

The CRC encoder 312 is a digital hardware implementation of a CRC encoder. The CRC encoder 312 receives ECC encoded data and calculates a CRC checksum that is stored with the ECC encoded data in macro-array 126. ECC encoded data including the original data and ECC parity data is provided to the CRC encoder 312. The CRC encoder 312 calculates a CRC checksum for the block of ECC encoded data including the original data and ECC parity data. The calculated CRC checksum is stored in array 126 with the ECC encoded data. In other embodiments, the CRC checksum is calculated for only the original data and not the ECC parity data. Also, in other embodiments, the CRC encoder 312 can be a software/firmware CRC encoder executed by the embedded processor 300 to provide a checksum for the ECC encoded data, or in the alternative, the original data. The storage interface 306 is controlled by embedded processor 300 to write the ECC encoded data and the CRC checksum into macro-array 126.

During a write operation, control circuit 22 receives an external write address and original data for writing the original data into macro-array 126. The embedded processor 300 retrieves the external write address from host interface 302 and looks up the corresponding array write address in non-volatile memory of the embedded processor 300. The array write address is the location in macro-array 126 where the original data can be written and takes into consideration remapping of external write addresses. The embedded processor 300 provides the array write address to storage interface 306 for writing the data into macro-array 126.

The original data received by host interface 302 is passed to buffer manager 308. The buffer manager 308 passes the received data to storage interface 306 and ECC encoder 30a. In the event ECC encoder 30a is busy processing data, such as encoding previously received data or holding data prior to passing the data to CRC encoder 312, buffer manager 308 stores, i.e. buffers, the received data in buffer memory 310. The buffer manager 308 and storage interface 306 communicate through a series of handshakes, such as through a ready/busy line, to transfer the stored original data to storage interface 306. Buffer manager 308 reads buffer memory 310 to retrieve the stored original data and provide the original data to the ECC encoder 30a in response to a ready signal from storage interface 306.

The ECC encoder 30a receives the original data from buffer manager 308 and encodes the original data using the [160, 128, 32] Reed-Solomon code to obtain ECC encoded data. ECC encoder 30a encodes an original data sector of 512 bytes by dividing the sector into four 128 byte portions of original data. Each 128 byte portion of original data is encoded with ECC encoder 30a to obtain 32 bytes of ECC parity data. The 128 bytes of original data and 32 bytes of ECC parity data make up a 160 byte codeword. The 512 bytes of original data become 640 bytes of ECC encoded data stored in four codewords of 160 bytes each. The ECC encoder 30a passes the ECC encoded data, one codeword at a time, to the CRC encoder 312.

CRC encoder 312 receives the ECC encoded data and calculates a CRC checksum for each codeword. The storage interface 306 stores the ECC encoded data and CRC checksum data in macro-array 126 at the array write address provided by embedded processor 300.

In the exemplary embodiment, an ECC encoded sector is stored as four sets of codeword and corresponding CRC checksum pairs. A first codeword is followed by the corresponding first CRC checksum that is between the first codeword and a second codeword. The second codeword is followed by the corresponding second CRC checksum that is between the second codeword and a third codeword, and so on. In other embodiments, the ECC encoded sector can be stored in other suitable arrangements, such as four sections of original data, followed by four sections of corresponding ECC parity data, followed by four corresponding CRC checksums.

In the exemplary embodiment, the CRC checksums are used to check the integrity of the ECC encoded data read from macro-array 126. A codeword and corresponding CRC checksum are read from macro-array 126. A new CRC checksum is calculated for the codeword read from macro-array 126. The new CRC checksum is compared to the retrieved CRC checksum. In the event the two checksums do not match, the ECC encoded data is deemed to be corrupted. The CRC checksum calculation and compare is very fast and consumes little power.

In another embodiment, storage interface 306 does not include a CRC encoder 312 and a CRC checksum is not calculated for the ECC encoded data. Instead, the ECC encoded data is written into macro-array 126 at the array write address provided by embedded processor 300 without a CRC checksum. The integrity of the ECC encoded data read from macro-array 126 is checked by evaluating parametric values of the macro-array 126. In one embodiment, resistance readings from memory cells 28 that store the ECC encoded data are taken while the ECC encoded data is read from macro-array 126. The resistance readings are compared to predetermined threshold values. In the event the resistance readings violate the threshold values, the ECC encoded data is deemed to be unreliable. The resistance readings may be outside the acceptable range due to systematic or random failures including physical failures of memory cells 28 and read circuit calibration and noise issues. The resistance readings and/or a flag indicating a threshold value failure is passed to storage interface 306 from macro-array 126. Circuits and methods for categorizing memory cell resistance readings are disclosed and described in U.S. patent application Ser. No. 10/727,273 filed Dec. 3, 2003, and titled "Memory Device", which is incorporated herein by reference.

In other embodiments, an odd/even parity calculation involving only one bit can be used to check the integrity of ECC encoded data read from macro-array 126. In other embodiments, parametric values from test memory cells 28 in macro-array 126 can be compared to threshold values. The test memory cells 28 can be located in rows and columns of macro-array 126. For example, one test memory cell 28 can be located in each row and one test memory cell 28 can be located in each column of macro-array 126. Resistance readings are taken from the test memory cells 28 in the rows and columns corresponding to the memory cells 28 storing the ECC encoded data read from macro-array 126. The test memory cell 28 resistance readings are compared to threshold values to indicate the reliability of the memory cells 28 storing the ECC encoded data read from macro-array 126. The resistance readings and/or a flag are passed to storage interface 306 to indicate the reliability of the ECC encoded data read from macro-array 126.

FIG. 7 is a diagram illustrating components of the exemplary embodiment of control circuit 22 for reading data from macro-array 126. Control circuit 22 includes the embedded processor 300, host interface 302, buffer circuit 304 and storage interface 306. The buffer circuit 304 includes buffer manager 308, buffer memory 310, multiplexer 330 and an ECC decoder 30b. The storage interface 306 includes a CRC decoder 332. In other embodiments, the ECC decoder 30b is part of storage interface 306.

The embedded processor 300 controls read operations and is in electrical communication, indicated at 315, with the host interface 302, buffer circuit 304 and storage interface 306. The host interface 302 is electrically coupled to external sources through I/O paths 42 and to buffer manager 308 through internal I/O paths 314. Embedded processor 300 controls the host interface 302 to receive data from and transmit data to external sources through I/O paths 42. The buffer circuit 304 includes the buffer manager 308 electrically coupled to the host interface through internal I/O paths 314, and to storage interface 306 through conductive paths, indicated at 316. In addition, the buffer manager 308 is electrically coupled to buffer memory 310 through memory input paths 318, and to multiplexer 330 through multiplexer output path 334. The buffer manager 308 controls data transfers to and from buffer memory 310.

Buffer memory 310 is electrically coupled to buffer manager 308 through memory input paths 318. In addition, buffer memory 310 is electrically coupled to ECC decoder 30b and multiplexer 330 through memory output paths 336. Buffer memory 310 is controlled by buffer manager 308 to provide data on memory output paths 336. Data provided on memory output paths 336 are either processed by ECC decoder 30b or passed directly to buffer manager 308 through multiplexer 330.

The ECC decoder 30b is part of ECC unit 30 and is electrically coupled to buffer memory 310 and multiplexer 330. In addition, ECC decoder 30b is in electrical communication with embedded processor 300, indicated at 315. The input of ECC decoder 30b is electrically coupled to buffer memory 310 and multiplexer 330 through memory output paths 336. The output of ECC decoder 30b is electrically coupled to multiplexer 330 through ECC decoder output paths 338.

The ECC decoder is a digital hardware ECC decoding unit that provides [160, 128,32] Reed-Solomon ECC decoding. The ECC decoder receives data through memory output paths 336 and is controlled by processor 300 to decode ECC encoded data. In other embodiments, the ECC decoder 30b can be a software/firmware ECC decoder executed by embedded processor 300. Also, in other embodiments, the ECC decoder can provide a different ECC decoding scheme, such as a [132, 128, 4] Reed-Solomon scheme or a BCH scheme.

The multiplexer 330 selects one of two data inputs and provides the output to buffer manager 308. One data input is electrically coupled to buffer memory 310 and the input of ECC decoder 30b through memory output paths 336. The other data input is electrically coupled to the ECC decoder output through ECC decoder output paths 338. The output of multiplexer 330 is electrically coupled to buffer manager 308 through multiplexer output path 334, and the select input of multiplexer 330 is electrically coupled to storage interface 306 through multiplexer select path 340. Storage interface 306 selects the input of multiplexer 330.

The storage interface 306 is the communication interface between control circuit 22 and macro-array 126. The storage interface 306 includes CRC decoder 332 situated between buffer circuit 304 and macro-array 126. The storage interface 306 is electrically coupled to buffer manager 308 through conductive paths, indicated at 316, and to multiplexer 330 through multiplexer select path 340. In addition, storage interface 306 is electrically coupled to macro-array 126 through conductive paths, indicated at 320.

The CRC decoder 332 is a digital hardware implementation of a CRC decode and compare circuit. The CRC decoder 332 is the counterpart of CRC encoder 312. In other embodiments, the CRC decoder 332 can be a software/firmware CRC decoder executed by the embedded processor 300.

The storage interface 306 is controlled by embedded processor 300 to read ECC encoded data and a CRC checksum from macro-array 126. CRC decoder 332 receives the ECC encoded data, such as a codeword, and the corresponding CRC checksum from macro-array 126. The CRC decoder 332 calculates a new CRC checksum for the received ECC encoded data. The CRC decoder 332 compares the newly calculated CRC checksum to the retrieved CRC checksum to obtain a matching or non-matching result. The CRC decoder 332 discards the CRC checksums and passes the comparison result to storage interface 306. The storage interface 306 passes the ECC encoded data to buffer manager 308. The buffer manager 308 stores the ECC encoded data in buffer memory 310.

In the event the CRC checksums match, storage interface 306 operates the select input on multiplexer 330 to select the input of multiplexer 330 electrically coupled to the output of buffer memory 310. Matching CRC checksums indicate the ECC encoded data is not corrupted and the ECC encoded data does not need to be passed through ECC decoder 30b.

In the event the CRC checksums do not match, storage interface 306 operates the select input on multiplexer 330 to select the output of ECC decoder 30b. Non-matching CRC checksums indicate that the ECC encoded data is corrupted and needs to be passed through ECC decoder 30b and corrected. The ECC encoded data is passed through ECC decoder 30b and corrected. The corrected original data, referred to as recovered data, are passed to the buffer manager 308.

During a read operation, control circuit 22 receives an external read address for reading original data from macro-array 126. The original data is stored as ECC encoded data with corresponding CRC checksums in macro-array 126. The embedded processor 300 retrieves the external read address from host interface 302 and looks up the corresponding array write address in non-volatile memory of embedded processor 300. The array write address is the location in macro-array 126 where the original data as ECC encoded data is stored. The embedded processor 300 provides the array write address to storage interface 306 with instructions to read ECC encoded data and CRC checksums from macro-array 126 at the provided array write address.

The storage interface 306 provides the array write address to macro-array 126 for reading ECC encoded data and corresponding CRC checksums from macro-array 126. The macro-array 126 reads memory cells 28 and returns the ECC encoded data and corresponding CRC checksums to storage interface 306. The retrieved ECC encoded data may not be the same as the ECC encoded data written to the macro-array 126. The retrieved ECC encoded data may include corrupted data.

Storage interface 306 passes the retrieved ECC encoded data and CRC checksums to CRC decoder 332 to check the integrity of the ECC encoded data. The CRC decoder 332 calculates a new CRC checksum for each codeword and compares the new CRC checksum to the CRC checksum corresponding to the selected codeword. The CRC checksum calculation is performed as the data is received from macro-array 126 and the comparison result is passed to storage interface 306 and embedded processor 300.

The storage interface 306 passes the retrieved ECC encoded data to buffer manager 308. The buffer manager 308 stores the ECC encoded data including the original data and ECC parity data in buffer memory 310. Embedded processor 300 controls the storage interface 306, buffer manager 308 and ECC decoder 30b to obtain correct original data from the ECC encoded data.

Embedded processor 300 instructs buffer manager 308 to provide a selected block of ECC encoded data at the output of buffer memory 310 and on memory output path 336. In the event the CRC checksums match for the selected block of ECC encoded data, embedded processor 300 controls storage interface 306 to select the input of multiplexer 330 coupled to the output of buffer memory 310. The ECC encoded data on memory output path 336 are passed through multiplexer 330 to buffer manager 308. Processor 300 instructs buffer manager 308 to discard the idle, i.e. unused, ECC parity data. Buffer manager 308 passes the unchanged original data to host interface 302 and external sources to complete the read operation.

In the event the CRC checksums do not match for the selected block of ECC encoded data, processor 300 controls ECC decoder 30b to decode the ECC encoded data on memory output path 336. The ECC decoder 30b decodes and corrects the ECC encoded data to obtain corrected original data, i.e. recovered data. The recovered data is passed from ECC decoder 30b, through ECC decoder output path 338 to multiplexer 330. Storage interface 306 selects the input of multiplexer 330 coupled to the output of ECC decoder 30b. The recovered data is passed to buffer manager 308 through multiplexer 330. The buffer manager 308 passes the recovered data as corrected original data to interface 302 and external sources to complete the read operation. Each ECC encoded data block is processed through buffer manager 308 to host interface 302. Buffer manager 308 interrupts embedded processor 300 as original data is passed to host interface 302 to indicate the buffer circuit 304 is ready to process another ECC encoded data block.

In the exemplary embodiment, the ECC decoder 30b executes a [160, 128, 32] Reed-Solomon code correction of ECC encoded data. In other embodiments, one or more other suitable ECC schemes can be used, such as [132, 128, 4] Reed-Solomon code correction or a BCH code correction.

In another embodiment, storage interface 306 does not include a CRC decoder 332 and the ECC encoded data is not stored with a CRC checksum. Instead, macro-array 126 reads memory cells 28 and obtains resistance sense readings. The resistance readings are compared to threshold values. In the event the resistance readings violate the threshold values, macro-array 126 passes an unreliable data indicator, such as the resistance readings and/or a flag, with the retrieved ECC encoded data to storage interface 306. The storage interface 306 and the entire control circuit 22 handles the resistance readings and/or flag similar to a CRC checksum mismatch. Unreliable retrieved ECC encoded data is passed through ECC decoder 30b to recover original data. The original data is passed to buffer manager 308 and host interface 302. In the event the resistance readings do not violate the threshold values, reliable retrieved ECC encoded data is passed to buffer manager 308, where the idle ECC parity data is discarded and the original data is passed to host interface 302.

In other embodiments, an odd/even parity calculation, involving one bit, can be used to check the integrity of ECC encoded data read from macro-array 126. In other embodiments, parametric values from test memory cells 28 in macro-array 126 can be compared to threshold values. The test memory cells 28 can be located in rows and columns of macro-array 126. For example, one test memory cell 28 can be located in each row and one test memory cell 28 can be located in each column of macro-array 126. Resistance readings are taken from the test memory cells 28 in the rows and columns corresponding to the memory cells 28 storing the ECC encoded data read from macro-array 126. The test memory cell 28 resistance readings are compared to threshold values to indicate the reliability of ECC encoded data read from the macro-array 126. The resistance readings and/or a flag are passed to storage interface 306 to indicate the reliability of the ECC encoded data read from macro-array 126.

Figure 8:
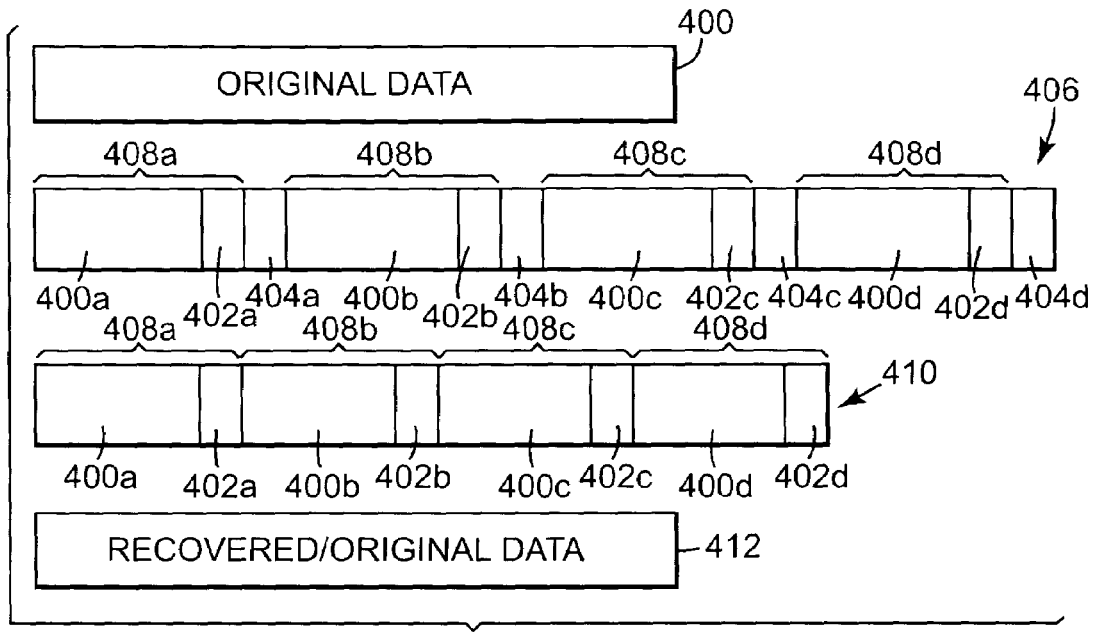
FIG. 8 is a diagram illustrating exemplary encoded and decoded data structures including original data.

FIG. 8 is a diagram illustrating exemplary encoded and decoded data structures including original data 400. The original data 400 is a sector of data that is 512 bytes. The original data 400 is received by host interface 302 and passed to buffer manager 308. The buffer manager 308 stores the received original data 400 in buffer memory 310. Buffer manager 308 divides the original data 400 into four equal original data sections 400a–400d. Through a series of handshakes with storage interface 306, buffer manager 308 passes each of the four original data sections 400a–400d to storage interface 306.

Storage interface 306 receives each original data section 400a–400d and passes each received original data section 400a–400d to the ECC encoder 30a. The ECC encoder 30a encodes each original data section 400a–400d to produce corresponding ECC parity data 402a–402d. The ECC encoder 30a passes each original data section 400a–400d with the corresponding ECC parity data 402a–402d to the CRC encoder 312. The CRC encoder 312 calculates a corresponding CRC checksum 404a–404d for each original data section 400a–400d and ECC parity data 402a–402d pair. The storage interface 306 organizes the original data section 400a–400d, ECC parity data 402a–402d and CRC checksums 404a–404d in an encoded data structure, indicated at 406.

The encoded data structure 406 includes four codewords 408a–408d. Each codeword 408a–408d includes an original data section 400a–400d and the corresponding ECC parity data 402a–402d. The four codewords 408a–408d are separated by CRC checksums 404a–404c, such that CRC checksum 404a is between codeword 408a and codeword 408b. CRC checksum 404b is between codeword 408b and codeword 408c, and CRC checksum 404c is between codeword 408c and codeword 408d. CRC checksum 404d is next to the corresponding codeword 408d.

Encoded data structure 406 includes each original data section 400a–400d next to the corresponding ECC parity data 402a–402d and the corresponding CRC checksum 404a–404d. The encoded data structure 406 is written into macro-array 126 as ECC encoded data with CRC checksums.

During a read operation, the encoded data structure 406 is read from macro-array 126 and received by storage interface 306. To check the integrity of the data in the received encoded data structure 406, the codewords 408a–408d are passed to CRC decoder 332 one at a time. A new CRC checksum is calculated for each codeword 408a–408d. The new checksums are compared to the retrieved CRC checksums 404a–404d to determine whether the ECC encoded data is corrupted. The storage interface 306 discards the retrieved CRC checksums 404a–404d and passes the codewords 408a–408d as CRC decoded data structure 410 to buffer manager 308. The buffer manager 308 stores the codewords 408a–408d in buffer memory 310.

The codewords 408a–408d are either passed to ECC decoder 30b or directly to buffer manager 308. Codewords 408a–408d passed to ECC decoder 30b are decoded and corrected to obtain recovered original data. The ECC decoder 30b discards the ECC parity data 402a–402d and passes the recovered data to buffer manager 308. Reliable codewords 408a–408d are passed to buffer manager 308 without decoding. Buffer manager 308 discards the idle ECC parity data 402a–402d to obtain the original data. The recovered data and original data are passed from the buffer manager 308 to the host interface 302 and external sources as recovered/original data 412.

Figure 9:
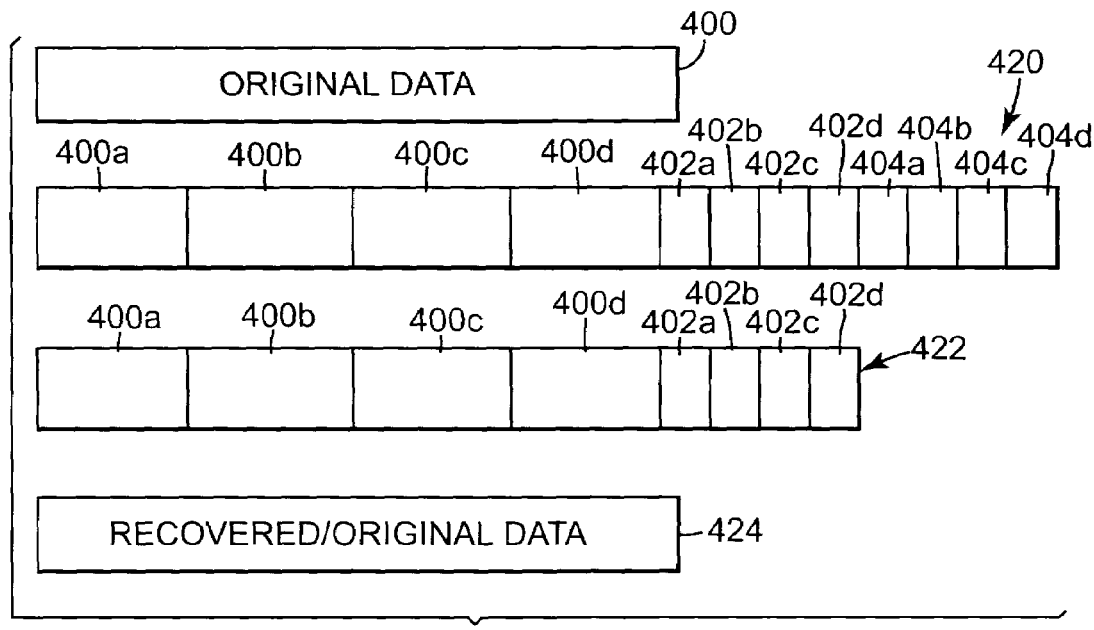
FIG. 9 is a diagram illustrating another set of encoded and decoded data structures including original data.

FIG. 9 is a diagram illustrating another set of encoded and decoded data structures including original data 400. The original data 400 is a sector of data that is 512 bytes. The original data 400 is received by host interface 302 and passed to buffer manager 308. The buffer manager 308 stores the received original data 400 in buffer memory 310. Through a series of handshakes with storage interface 306, buffer manager 308 passes four equal original data sections 400a–400d to storage interface 306.

Storage interface 306 receives each original data section 400a–400d and passes each received original data section 400a–400d to the ECC encoder 30a. The ECC encoder 30a encodes each original data section 400a–400d to produce corresponding ECC parity data 402a–402d. The ECC encoder 30a passes each original data section 400a–400d with the corresponding ECC parity data 402a–402d to the CRC encoder 312. The CRC encoder 312 calculates a corresponding CRC checksum 404a–404d for each original data section 400a–400d and ECC parity data 402a–402d pair. The storage interface 306 organizes the original data section 400a–400d, ECC parity data 402a–402d and CRC checksums 404a–404d in an encoded data structure, indicated at 420.

The encoded data structure 420 includes four original data sections 400a–400d situated side-by-side. The four ECC parity data sections 402a–402d are situated side-by-side and located next to the four original data sections 400a–400d. The four CRC checksums 404a–404d are situated side-by-side and next to the four ECC parity data sections 402a–402d. The encoded data structure 420 is written into macro-array 126 as ECC encoded data with CRC checksums 404a–404d.

During a read operation, the encoded data structure 420 is read from macro-array 126 and received by storage interface 306. To check the integrity of the data in the received encoded data structure 420, an original data section 400a–400d and the corresponding ECC parity data 402a–402d are passed to CRC decoder 332. For example, original data section 400a and ECC parity data 402a are passed to CRC decoder 332. The CRC decoder 332 calculates a new CRC checksum and compares the new CRC checksum to the corresponding retrieved CRC checksum 404a–404d. In the example, the new CRC checksum is compared to CRC checksum 404a. The new and retrieved CRC checksums 404a–404d are compared to determine whether the ECC encoded data are corrupted. The CRC decoder 332 and storage interface 306 discard the CRC checksums 404a–404d and pass the CRC decoded data structure 422 to buffer manager 308. The buffer manager 308 stores the CRC decoded data structure 422 in buffer memory 310.

The original data sections 400a–400d with the corresponding ECC parity data 402a–402d are passed to ECC decoder 30b or directly to buffer manager 308. Original data sections 400a–400d and ECC parity data 402a–402d passed to ECC decoder 30b are decoded and corrected to obtain recovered original data. The ECC decoder discards the ECC parity data 402a–402d and passes the recovered data to buffer manager 308. Reliable original data 400a–400d and ECC parity data 402a–402d passed directly to buffer manager 308 is not decoded. Instead, the ECC parity data 402a–402d is discarded. The original data 400a–400d is combined with recovered data in a recovered/original data structure, indicated at 424. The recovered/original data structure 424 is passed from buffer manager 308 to host interface 302 and external sources.

What is claimed is:

1. A memory, comprising:
an array of memory cells; and
a control circuit configured to read error correction coded data from the array of memory cells, to evaluate the integrity of the error correction coded data and select error correction coded data having compromised integrity, and to provide error correction code decoding to only the selected error correction coded data and to discard unused error correction code parity data of unselected error correction coded data.

2. The memory of claim 1, where the control circuit, to evaluate the integrity of the error correction coded data, is configured to calculate a checksum of the error correction coded data, compare the calculated checksum to a retrieved checksum, and select error correction coded data if the calculated checksum differs from the retrieved checksum.

3. The memory of claim 1, where the control circuit, to evaluate the integrity of the error correction coded data, is configured to calculate odd/even parity of the error correction coded data, compare the calculated odd/even parity to an expected odd/even parity, and select error correction coded data if the calculated odd/even parity differs from the expected odd/even parity.

4. The memory of claim 1, where the control circuit, to evaluate the integrity of the error correction coded data, is configured to evaluate parametric data from the array of memory cells and to select error correction coded data based on the parametric data evaluation.

5. The memory of claim 1, where the control circuit comprises a memory buffer configured to receive the error correction coded data, provide the selected error correction coded data to an error correction code decoder and provide the unselected error correction coded data to a buffer circuit configured to discard the unused error correction parity data of the unselected error correction coded data.

6. The memory of claim 1, where the control circuit is configured to provide a Reed-Solomon error correction code.

7. The memory of claim 1, where the array of memory cells is a macro-array of magnetic memory cells.

8. The memory of claim 1, where the array of memory cells is a phase-change random access memory array of memory cells.

9. The memory of claim 1, where the array of memory cells is a FLASH random access memory array of memory cells.

10. The memory of claim 1, where the array of memory cells is a probe based memory array of memory cells.

11. A magnetic memory, comprising:
   a macro-array of memory cells; and
   a control circuit configured to read the macro-array of memory cells to obtain ECC encoded data comprising ECC parity data, evaluate the ECC encoded data reliability while leaving the ECC parity data idle, and provide error correction decoding to only the ECC encoded data deemed unreliable based on the reliability evaluation.

12. The magnetic memory of claim 11, where the control circuit is configured to evaluate the ECC encoded data reliability using resistance readings from the macro-array of memory cells.

13. The magnetic memory of claim 11, where the control circuit is configured to evaluate the ECC encoded data reliability using resistance readings from test memory cells in the macro-array of memory cells.

14. The magnetic memory of claim 11, where the control circuit is configured to evaluate the ECC encoded data reliability using logic states from memory cells in the macro-array of memory cells.

15. The magnetic memory of claim 11, where the control circuit is configured to evaluate the ECC encoded data reliability using a CRC checksum of the ECC encoded data.

16. The magnetic memory of claim 11, where the control circuit is configured to store a CRC checksum next to each codeword of the ECC encoded data.

17. The magnetic memory of claim 11, where the control circuit is configured to store a group of original data next to a group of ECC parity data that is next to a group of CRC checksums.

18. The magnetic memory of claim 11, where the control circuit comprises:
   a processor;
   a storage interface configured to communicate with the macro-array of memory cells; and
   a buffer circuit comprising a buffer memory.

19. The magnetic memory of claim 18, where the storage interface is configured to evaluate the ECC encoded data reliability and select the ECC encoded data for error correction decoding, where the processor is configured to evaluate the ECC encoded data reliability and select the ECC encoded data for error correction decoding, where the buffer circuit is configured to discard idle ECC parity data, where the storage interface is configured to provide CRC encoding, CRC decoding and discarding of CRC checksums, and where the storage interface is configured to provide error correction encoding of original data.

20. A magnetic memory, comprising:
   means for storing data encoded with an ECC scheme;
   means for reading the ECC encoded data;
   means for identifying corrupted ECC encoded data; and
   means for decoding only ECC encoded data identified as corrupted.

21. The magnetic memory of claim 20, where the means for identifying corrupted ECC encoded data comprises evaluating at least one from a group comprising:
   logic states of memory cells;
   parametric values of memory cells;
   an odd/even parity check of the ECC encoded data; and
   a checksum of the ECC encoded data.

22. The magnetic memory of claim 20, where the means for decoding comprises:
   a buffer circuit configured to provide corrupted ECC encoded data to an ECC decoding unit and discard ECC parity data of uncorrupted ECC encoded data.

23. The magnetic memory of claim 20, where the means for decoding comprises a Reed-Solomon ECC decoding unit.

24. The magnetic memory of claim 20, where the means for decoding comprises a BCH ECC decoding unit.

25. A method for writing to and reading from a magnetic memory, comprising:
   reading ECC encoded data from the memory;
   evaluating non-ECC parity data to obtain an evaluation result; and
   decoding the ECC encoded data to obtain recovered data only if the evaluation result indicates the ECC encoded data is corrupted.

26. The method of claim 25, comprising:
   receiving original data;
   encoding the received original data with an ECC scheme;
   calculating CRC checksums for the ECC encoded data; and
   writing the ECC encoded data and the CRC checksums into the memory.

27. The method of claim 26, where reading ECC encoded data comprises retrieving the ECC encoded data and the CRC checksums, and evaluating non-ECC parity data comprises:
   calculating CRC checksums for the ECC encoded data; and
   comparing the calculated CRC checksums to the retrieved CRC checksums to obtain compare results that indicate whether the ECC encoded data is corrupted.

28. The method of claim 25, comprising:
   providing recovered data from corrupted ECC encoded data;
   discarding the ECC parity data from uncorrupted ECC encoded data; and
   providing original data from the uncorrupted ECC encoded data.

* * * * *